United States Patent [19]

Mehrotra et al.

[11] Patent Number: 5,493,134
[45] Date of Patent: Feb. 20, 1996

[54] BIDIRECTIONAL AC SWITCHING DEVICE WITH MOS-GATED TURN-ON AND TURN-OFF CONTROL

[75] Inventors: Manoj Mehrotra; Bantval J. Baliga, both of Raleigh, N.C.

[73] Assignee: North Carolina State University, Raleigh, N.C.

[21] Appl. No.: 338,392

[22] Filed: Nov. 14, 1994

[51] Int. Cl.$^6$ .......................... H01L 29/74; H01L 31/111
[52] U.S. Cl. .......................... 257/132; 257/139; 257/153; 257/331; 257/334; 257/378
[58] Field of Search .................................. 257/119, 146, 257/329, 378, 135, 132, 133, 139, 331, 330, 334, 147, 153

[56] References Cited

U.S. PATENT DOCUMENTS

| | | | |
|---|---|---|---|
| 4,799,095 | 1/1989 | Baliga | 257/135 X |
| 4,827,321 | 5/1989 | Baliga | 357/37 |
| 4,835,586 | 5/1989 | Cogan et al. | 357/23.14 |
| 4,857,977 | 8/1989 | Temple | 357/23.4 |
| 4,857,983 | 8/1989 | Baliga et al. | 357/38 |
| 4,912,541 | 3/1990 | Baliga et al. | 357/38 |
| 4,954,869 | 9/1990 | Bauer | 357/38 |
| 4,956,690 | 9/1990 | Kato | 357/38 |
| 4,959,703 | 9/1990 | Ogura et al. | 357/38 |
| 4,961,100 | 10/1990 | Baliga et al. | 357/39 |
| 4,963,950 | 10/1990 | Chang et al. | 357/23.4 |
| 4,963,972 | 10/1990 | Shinohe et al. | 357/38 |
| 4,967,243 | 10/1990 | Baliga et al. | 357/23.4 |
| 4,982,258 | 1/1991 | Baliga | 357/38 |
| 4,994,871 | 2/1991 | Chang et al. | 357/23.4 |
| 5,014,102 | 5/1991 | Adler | 357/38 |
| 5,032,888 | 7/1991 | Seki | 357/37 |
| 5,172,208 | 12/1992 | Malhi | 257/476 |
| 5,202,750 | 4/1993 | Gough | 257/133 |
| 5,233,215 | 8/1993 | Baliga | 257/490 |
| 5,298,781 | 3/1994 | Cogan et al. | 257/333 |
| 5,304,821 | 4/1994 | Hagino | 257/133 |
| 5,317,171 | 5/1994 | Shekar et al. | 257/138 |
| 5,319,221 | 6/1994 | Ueno | 257/135 |

OTHER PUBLICATIONS

H. R. Chang et al., "500–V n–Channel Insulated–Gate Bipolar Transistor with a Trench Gate Structure", IEEE Transactions on Electron Devices, vol. 36, No. 9, Sep. 1989.
B. Jayant Baliga et al., "The MOS Depletion–Mode Thyristor: A New MOS–Controlled Bipolar Power Device", IEEE Electron Device Letters, vol. 9, No. 8, Aug. 1988.
B. Jayant Baliga, Modern Power Devices, John Wiley & Sons, Inc., 1987, pp. 314–319, 344–406.
D. S. Kuo et al., "Modeling the Turn–Off Characteristics of the Bipolar–MOS Transistor", IEEE Electron Device Letters, vol. EDL–6, No. 5, May 1985.
B. J. Baliga, "Analysis of Insulated Gate Transistor Turn–Off Characteristics", IEEE Electron Device Letters, vol. EDL–6, No. 2, Feb. 1985.

Primary Examiner—William Mintel
Attorney, Agent, or Firm—Bell, Seltzer, Park & Gibson

[57] ABSTRACT

A bidirectional semiconductor switching device includes a semiconductor substrate having first and second device terminals on opposite faces thereof, a thyristor in the substrate for providing regenerative conduction in a first direction, between the first device terminal and the second device terminal, and an insulated-gate bipolar junction transistor (IGBT) in the substrate for providing nonregenerative conduction in a second opposite direction, between the second device terminal and the first device terminal. In particular, the switching device includes first and second adjacent trenches therein at a face and respective first and second insulated-gate field effect transistors (IGFETs) in the trenches for providing gate-controlled turn-on and turn-off of the thyristor and the IGBT, by being electrically connected in series therewith.

37 Claims, 9 Drawing Sheets

BIDIRECTIONAL AC SWITCHING DEVICE WITH MOS-GATED TURN-ON AND TURN-OFF CONTROL

FIELD OF THE INVENTION

The present invention relates to semiconductor switching devices and more particularly to bidirectional semiconductor switching devices.

BACKGROUND OF THE INVENTION

Thyristors are commonly used for high current and high voltage applications in motor drive circuits, appliance controls, robotics, lighting ballasts, solid-state relays, power inversion in high-voltage transmission lines and in other high power applications. This is because thyristors exhibit bistable characteristics and can be switched between a high-impedance, low-current OFF state and a low-impedance, high-current ON state. Thyristors are now available with current ratings from a few milliamperes to over 5000 A and voltage ratings extending above 10,000 V. A comprehensive treatment of the operation of thyristors can be found in a textbook entitled *Semiconductor Power Devices*, by S. K. Ghandhi, John Wiley & Sons, N.Y. (1977).

Semiconductor switching devices such as the diode AC switch (DIAC) of FIG. 1 and the triode AC switch (TRIAC) of FIG. 3 have also been used extensively for high power AC switching applications. This is because they offer thyristor characteristics in two directions and have ON and OFF states for both positive and negative anode voltages. These characteristics are illustrated by FIGS. 2 and 5, which contain the first and third quadrant I-V curves for the DIAC and TRIAC, respectively. As will be understood by those skilled in the art, the TRIAC is essentially two thyristors connected in antiparallel and as illustrated by FIGS. 4a-d, the on-state currents flow in two different areas depending on the quadrant of operation. This implies that for a given current rating, the area of a conventional TRIAC is twice that of a similar unidirectional thyristor. These and other aspects of TRIACs are described in the textbook entitled *Physics of Semiconductor Devices*, by S. M. Sze, John Wiley & Sons, N.Y., pp. 229–234 (1981). In addition to the above described properties, the TRIAC also requires a moderate amount of gate current to trigger it into conduction in both the first and third quadrant modes of operation and does not exhibit current saturation at high voltages or gate-controlled turn-off capability. Instead, the TRIAC is turned off by reversing the anode potential. These features of the TRIAC cause it to lack both forward-biased safe-operating-area (FBSOA) and reverse-biased safe-operating-area (RBSOA).

Therefore, notwithstanding the extensive use of TRIACs for high-power AC applications, there continues to be for a high power semiconductor switching device which has reduced lateral dimensions, current saturation and low power gate controlled turn-on and turn-off capability in both the first and third quadrants of operation.

SUMMARY OF THE INVENTION

It is therefore an object of the present invention to provide a bidirectional semiconductor switching device with low power gate-controlled turn-on and turn-off capability in both the first and third quadrants of operation.

It is another object of the present invention to provide a bidirectional semiconductor switching device having excellent forward-biased safe-operating-area (FBSOA) in both the first and third quadrants of operation.

It is a further object of the present invention to provide a bidirectional semiconductor switching device which can be saturated to high voltages.

It is still another object of the present invention to provide a vertical semiconductor switching device with reduced lateral dimensions.

These and other objects, advantages and features are provided, according to the present invention, by a bidirectional switching device which provides gate-controlled regenerative conduction in a first direction, from a first device terminal to a second device terminal, and provides gate-controlled regenerative and nonregenerative conduction in a second opposite direction, from the second device terminal to the first device terminal. Regenerative conduction is preferably provided in the first direction by a thyristor having regeneratively coupled N-P-N and P-N-P bipolar junction transistors (BJTs) therein. Nonregenerative conduction is also preferably provided in the second direction by a P-N-P (or N-P-N) bipolar junction transistor, although regenerative conduction may also be provided in the second direction. Accordingly, the thyristor and bipolar junction transistor are electrically connected in antiparallel, with nonregenerative conduction occurring in the first quadrant of operation and regenerative conduction occurring in the third quadrant of operation. Moreover, both the regenerative and nonregenerative currents traverse the same area of the device, which improves the area utilization by a factor of two when compared to a conventional bidirectional switching device such as the TRIAC.

In particular, the bidirectional switching device preferably includes a semiconductor substrate having a plurality of back-to-back P-N junctions therein which collectively form a thyristor extending in the first direction and a bipolar junction transistor extending in the second opposite direction. Turn-on and turn-off control of both the bipolar junction transistor and the thyristor is provided by first and second insulated-gate field effect transistors (IGFETs). These first and second IGFETs extend in series between the base and collector of the bipolar junction transistor, respectively, and the first device terminal. Accordingly, the bipolar junction transistor and the first field effect transistor collectively form an insulated-gate bipolar transistor (IGBT). The first and second IGFETs also extend in series between the first base (/second collector) and the first emitter of the thyristor, respectively, and the first device terminal. According to a preferred embodiment, the insulated gate electrodes for the first and second IGFETs are provided in first and second adjacent trenches, respectively, which extend into the substrate at a first face thereof. These trenches may be of stripe, rectangular, circular or similar geometry.

The aforementioned back-to-back P-N junctions are preferably formed by: a first semiconducting device region (e.g., drift region) of first conductivity type in the substrate; a second semiconducting device region of second conductivity type which extends between the first device region and the first device terminal; a third semiconducting device region (e.g., diffused "well") of second conductivity type which is preferably formed in the first device region and ohmically contacts the second device terminal at a second face of the substrate; and a fourth semiconducting device region (e.g., diffused "well") of first conductivity type which is preferably formed in the third device region and also ohmically contacts the second device terminal at the second face of the substrate.

The base, collector and emitter of the IGBT are also formed by the first, second and third semiconducting device regions. In addition, the first and second emitters and the first and second collectors of the thyristor are also formed by the second and fourth semiconducting device regions and by the third and first semiconducting device regions, respectively. Finally, first and second source regions are provided between the second device region and the first device terminal and between the first and second trenches. These first and second source regions act as the source of the first and second IGFETs, respectively, and ohmically contact the first device terminal at the first face. The first source region also acts as the channel region of the second IGFET.

Accordingly, a bidirectional switching device is provided which has first and second "trench" IGFETs for providing gate-controlled turn-on and turn-off in both the first and third quadrants of operation. The device current also traverses the same area in both directions which allows the device to be manufactured with reduced lateral dimensions. The device current can also be saturated to high voltages in both directions which results in a large improvement in safe-operating-area compared to conventional switching devices.

BRIEF DESCRIPTION OF THE DRAWINGS

FIG. 7b is an electrical schematic representation of the switching cell of FIG. 7a.

DESCRIPTION OF PREFERRED EMBODIMENTS

Figure 1:
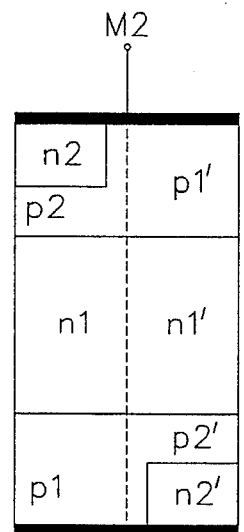
FIG. 1 illustrates a cross-sectional representation of a prior art bidirectional P-N-P-N diode AC switch (DIAC).
Figure 2:
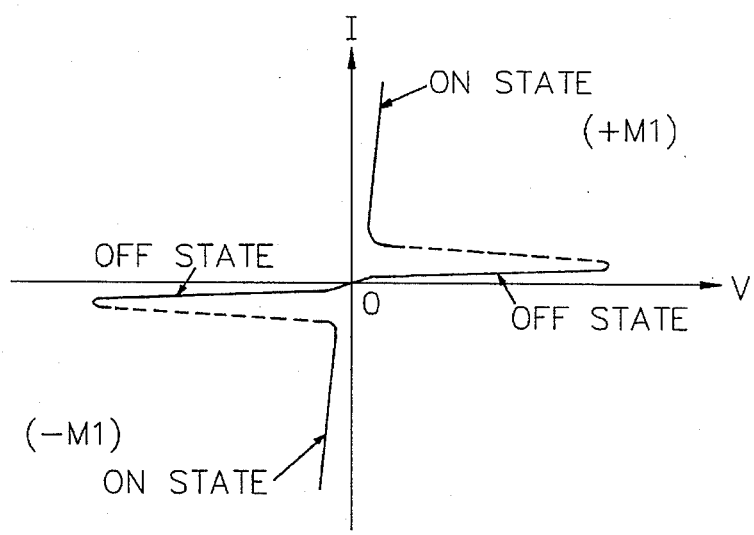
FIG. 2 illustrates ideal current-voltage characteristics for the DIAC of FIG. 1.
Figure 3:
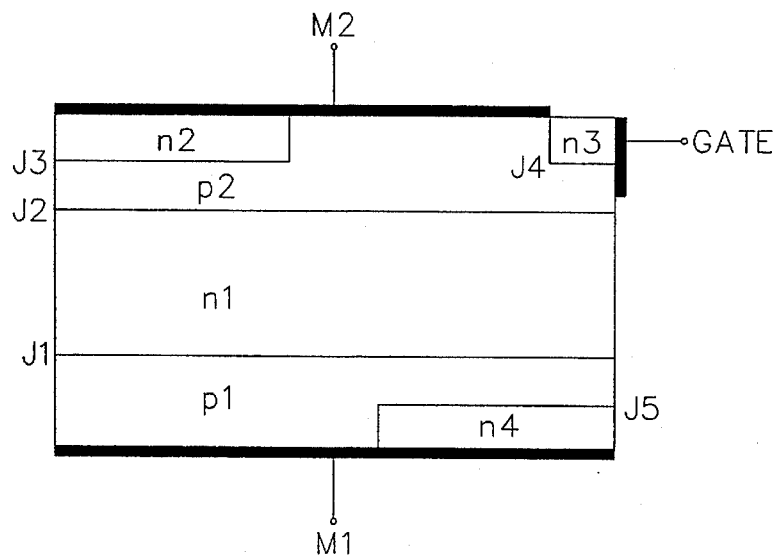
FIG. 3 illustrates a cross-sectional representation of a prior art six-layer triode AC switch (TRIAC).
Figure 4A:
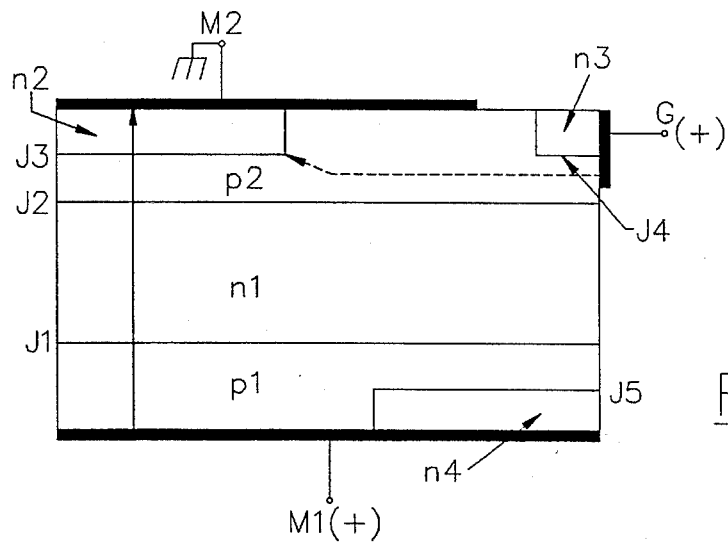
FIGS. 4A–D illustrates current flow in four different triggering modes for the TRIAC of FIG. 3.
Figure 4B:
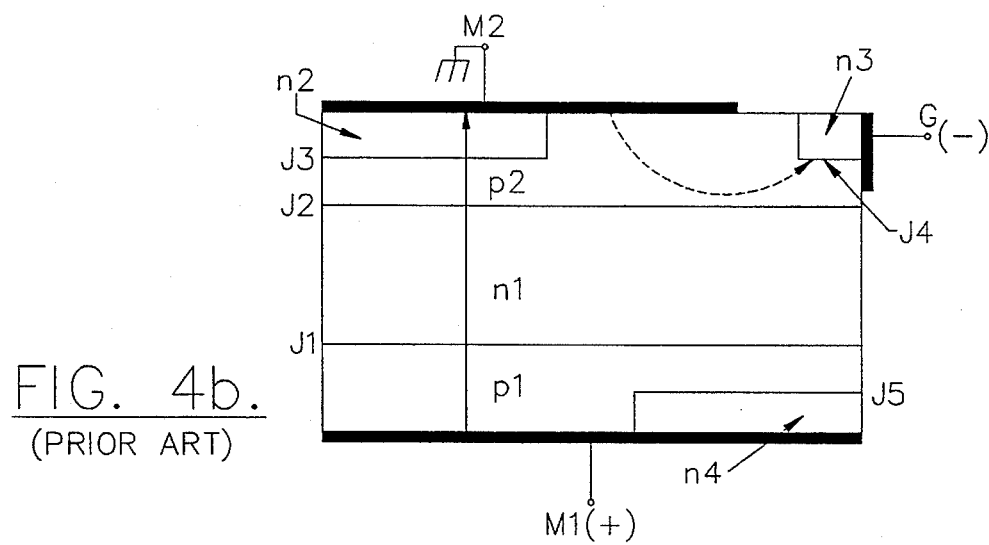
Figure 4C:
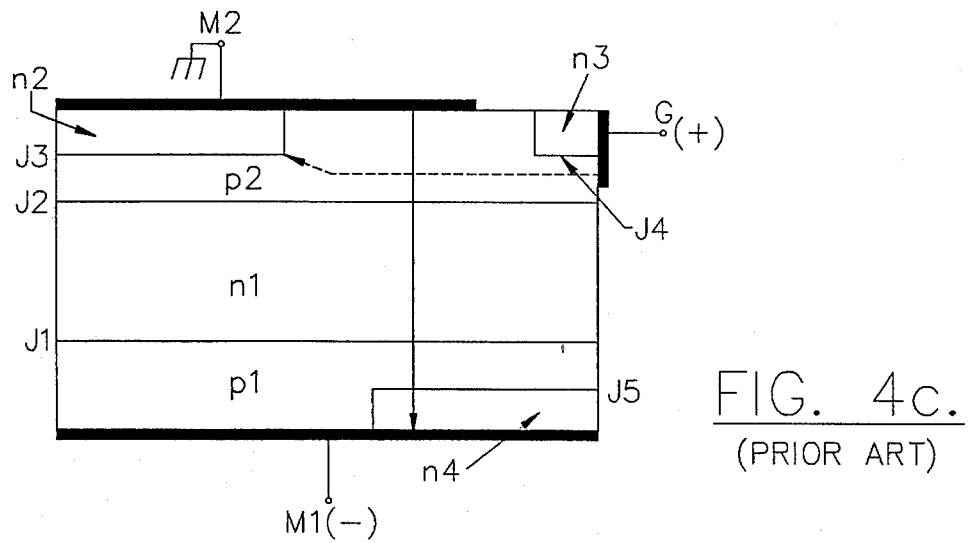
Figure 4D:
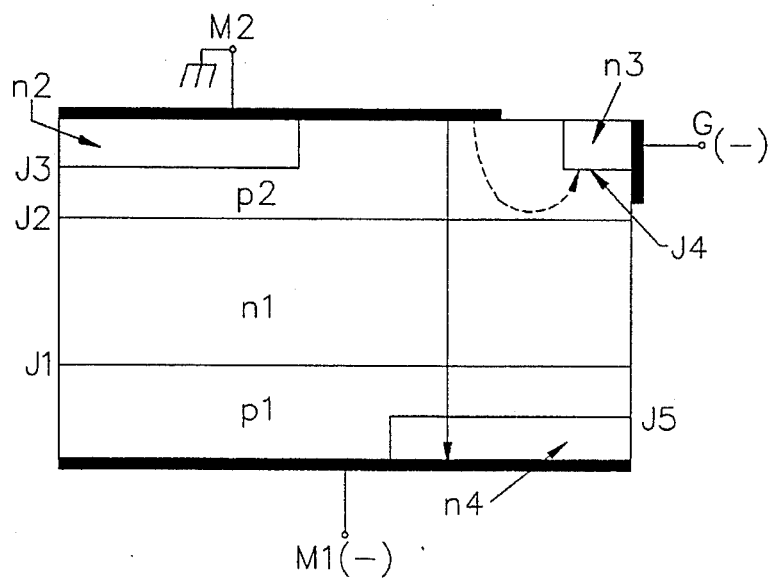
Figure 5:
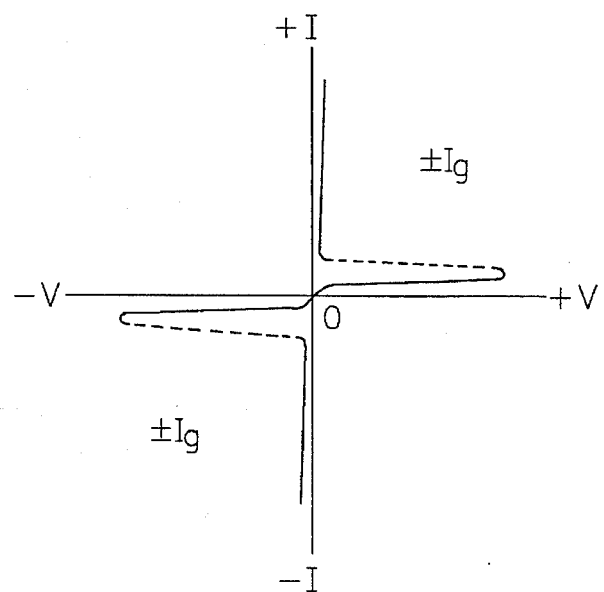
FIG. 5 illustrates ideal current-voltage characteristics for the TRIAC of FIG. 3.

The present invention now will be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 6:
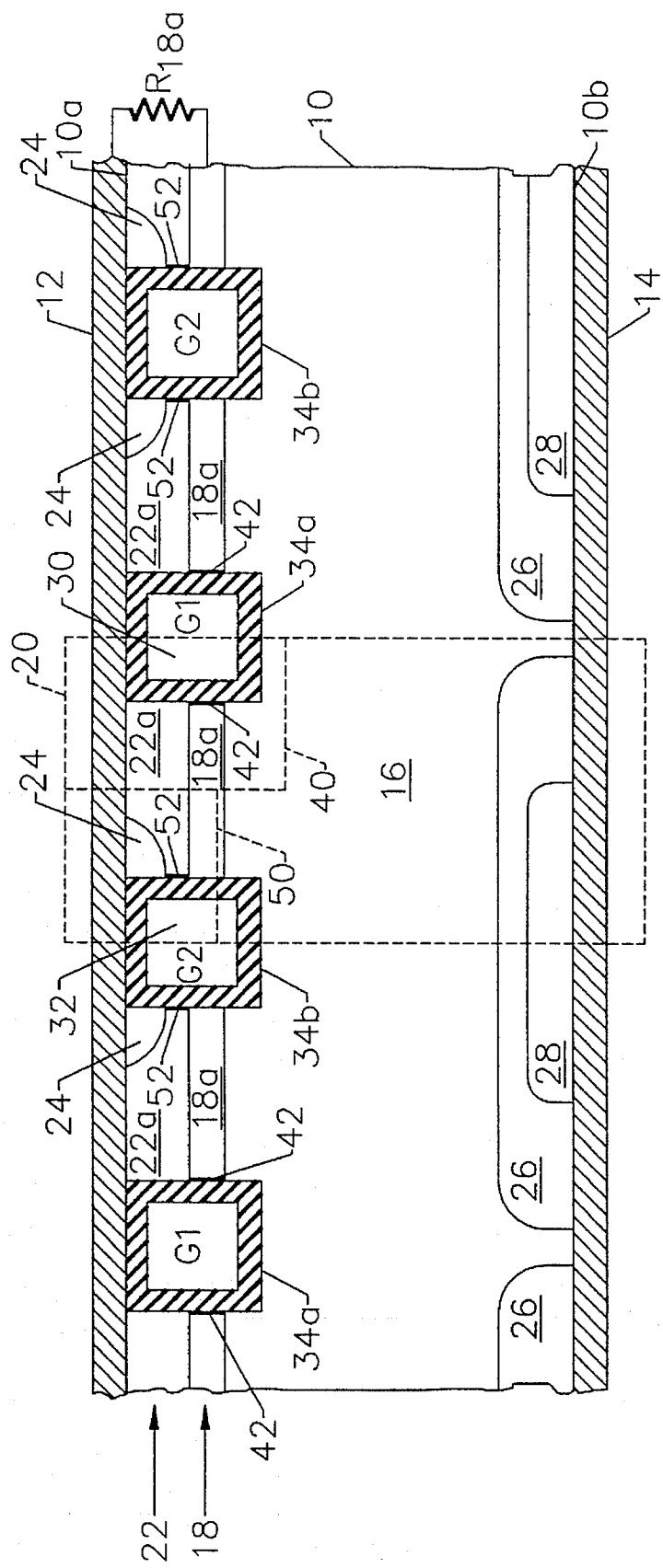
FIG. 6 is a cross-sectional illustration of a bidirectional semiconductor switching device including a plurality of switching cells, according to a first embodiment of the present invention.

Referring now to FIG. 6, a bidirectional semiconductor switching device according to a first embodiment of the present invention is illustrated. The switching device is preferably formed in a semiconductor substrate 10 having first and second opposing faces 10a–b. According to the first embodiment, the switching device includes a plurality of unit switching cells 20 connected in parallel between first and second conductive device terminals 12 and 14 which extend on the first and second faces 10a–b of the substrate 10, as illustrated. In particular, the substrate 10 includes a first semiconducting device region 1.6 of first conductivity type (shown as N-type) therein. The first semiconducting device region 16 is commonly referred to as a "drift" region.

Each cell 20 of the switching device preferably includes first and second adjacent trenches 34a–b, respectively, which can be formed in the substrate 10 at the first face 10a, using conventional etching techniques. These trenches preferably extend into the first device region 16, as illustrated. As will be understood by those skilled in the art, the trenches can be of stripe or similar geometry and also extend in a third dimension, not shown. The trenches 34a–b also include first and second electrodes 30 and 32 therein for controlling turn-on and turn-off of the switching device. The electrodes may be formed of polycrystalline silicon, metal or a similar conductive material. The trenches are also lined with an electrically insulating layer such as silicon dioxide ($SiO_2$) which may be deposited or grown on the bottoms and sidewalls of the trenches 34a–b. As explained more fully hereinbelow, the first and second electrodes 30 and 32 comprise insulated gate electrodes (G1 and G2) of first and second vertical insulated-gate field effect transistors (IGFETs), respectively.

The switching device according to the first embodiment of the present invention also includes a plurality of second semiconducting device regions 18a of second conductivity type (shown as P-type) in the substrate 10. The second device regions 18a extend adjacent the first device region 16 and form P-N junction is therewith. The second device regions 18a can be formed by implanting second conductivity type dopants into the first face 10a so that a second conductivity type layer 18 is formed on the first device region 16. A plurality of first source regions 22a of first conductivity type are also preferably formed between respective second device regions 18a and the first face 10a, as illustrated. The first source regions 22a may also be formed by implanting first conductivity type dopants into the second conductivity type layer 18 so that a first conductivity type layer 22 is formed as illustrated. These steps are then followed by the step of etching trenches 34a–b into the substrate 10 so that the trenches extend through both the first and second conductivity type layers (22 and 18). Second source regions 24 of second conductivity type are also preferably formed in respective ones of the first source regions 22a and adjacent the sidewalls of the second trenches 34b, as illustrated. The second source regions 24 may also be formed from a plurality of second conductivity regions (not shown) which are diffused into the first conductivity type layer 22 prior to etching the trenches 34a–b. The first device terminal 12 also ohmically contacts the first and second source regions 22a and 24 at the first face 10a.

As will be understood by those skilled in the art, the first insulated gate electrode G1, the first device region 16, the second device region 18a and the first source region 22a of the unit cell 20 collectively form the gate, drain, channel region and source of a first insulated-gate field effect transistor 40. Accordingly, the first insulated-gate field effect transistor 40 is electrically connected in series (source→drain) between the first source region 22a (or first device terminal 12) and the first device region 16. This series electrical connection is controlled by the first gate electrode G1, which modulates the "surface" conductivity of the second device region 18a, adjacent the sidewall of the trench 34a. As schematically illustrated by resistance $R_{18a}$, the second device region is electrically connected to the first device terminal in the third dimension, not shown. As will be understood by those skilled in the art, the application of a sufficiently positive gate bias to G1 (relative to the second device region 18a) will cause the formation of an N-type inversion layer channel 42 in the second device region 18a. This conductive channel 42 electrically connects the first source region 22a (source) to the first device region 16 (drain).

Similarly, the second insulated gate electrode G2, the second device region 18a, the first source region 22a and the second source region 24 of the unit cell 20 collectively form the gate, drain, channel region and source of a second insulated-gate field effect transistor 50. Thus, the second insulated-gate field effect transistor 50 is electrically connected in series (source→drain) between the second source region 24 (or first device terminal 12) and the second device region 18a, and the conductivity of this series electrical connection is controlled by the second gate electrode G2. As illustrated, the application of a sufficiently negative bias to G2 (relative to the first source region 22a) will cause the formation of a P-type inversion layer channel 52 in the first source region 22a. This conductive channel 52 electrically connects the second source region 24 (source) to the second device region 18a (drain).

Referring still to FIG. 6, the switching device also includes a plurality of third semiconducting device regions 26 of second conductivity type which extend adjacent the first semiconducting device region 16 and form P-N junctions therewith. Each of these regions preferably comprises a diffused "well" of second conductivity type dopants at the second face 10b and can be formed using conventional techniques. A plurality of fourth semiconducting device regions 28 of first conductivity type are also formed in respective ones of the third device regions 26, as illustrated. These regions 28 also preferably comprise diffused "wells" of first conductivity type dopants. As illustrated, the first device region 16 preferably extends between adjacent ones of the third device regions 26 and to the second device terminal. In addition, the widths of the wells 26, 28 can be significantly greater than the width of the unit cell 20. For example, the widths of the wells 26, 28 can be 64 and 40 μm, respectively, for a unit cell having a width of 4 μm.

The first device region 16 and the third and fourth device regions 26 and 28 also ohmically contact the second device terminal 14 at the second face 10b. Alternatively, the third semiconducting device region may also be formed as a continuous second conductivity type region by performing a blanket implant at the second face 10b. However, because the first device region 16 will no longer ohmically contact the second device terminal 14, an additional remote gate electrode may be needed to provide charge carriers to the first device region to cause turn-on. Such as remote gate electrode may be provided as a separate terminal on the first face 10a.

Referring now to FIGS. 7a–d, the operation of the unit switching cell 20 of FIG. 6 in both the first and third quadrant modes of operation will be explained. For clarity, regions 12, 14, 24, 22a, 16, 18a, 26 and 28 have been relabelled as T1, T2, P1, N1, P2, N2, P3, and N3 on FIGS. 7a–d, respectively, where "P" and "N" represent regions of P-type and N-type conductivity. However it is contemplated that complimentary structures may also be formed according to the present invention. The first and second IGFETs 40 and 50 have also been relabelled as M1 and M2 in FIGS. 7b and 7d, respectively, and the N-type and P-type inversion layer channels 42, 52 have been relabelled as C1 and C2 in FIGS. 7a and 7c. As described above, gate electrode G1 controls M1 which can connect the first source region N1 (and the first device terminal T1) to the drift region N2 by an inversion layer channel C1 in the second device region P2 (i.e., P-base). Similarly, gate electrode G2 controls M2 which electrically connects or shunts the P-base region P2 to the first device terminal T1 via an inversion layer channel C2, which is formed in the first source region N1.

Figure 7A:
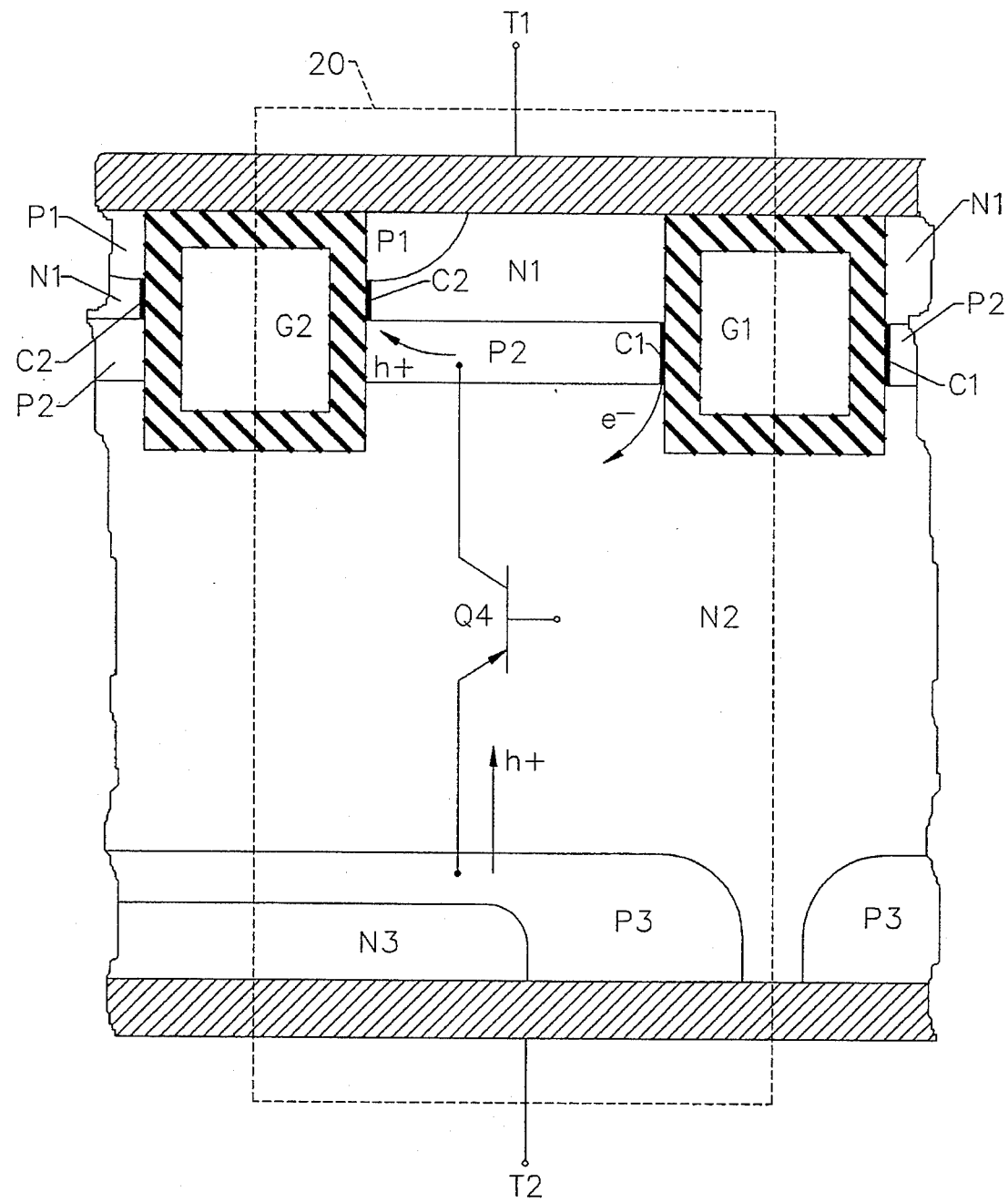
FIG. 7a is a cross-sectional illustration of the switching cell of FIG. 6, in a first quadrant mode of operation.
Figure 7B:
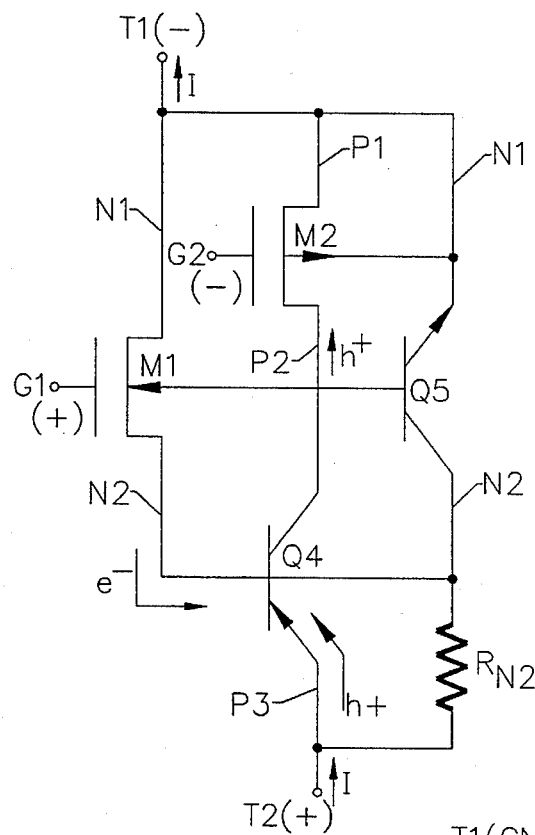

Referring now to FIGS. 7a–b, the first quadrant mode of operation will be explained. The first quadrant mode can be initiated by: (i) biasing G1 to a positive potential relative to P2, (ii) biasing G2 to a negative potential relative to T1, and (iii) biasing the second device terminal T2 positive relative to T1. This causes the switching cell 20 to operate as an IGBT with the P-base P2 electrically connected in series with T1 by M2 and with N2 electrically connected in series with T1 by M1. In particular, the appropriate biasing of G1 and G2 causes the formation of the series electrical connections ("shorts") C1 and C2 between the sources and drains of M1 and M2, respectively. Furthermore, this biasing of G1 and G2 causes the injection of holes ($h^+$) from P3 to N2 along a predetermined path and the injection of electrons ($e^-$) from T1 to N2, as illustrated. The holes are then removed from N2 by P2, which is the collector of the vertical PB-N2-P2 bipolar junction transistor (Q4), and then the holes traverse the second inversion layer channel C2 to P1 and T1. As will be understood by those skilled in the art, the injected electrons act as the base drive current for Q4 which in combination with M1 forms an IGBT according to the present invention. The collector (P2) of this IGBT is also electrical connected is series with M2, which has its drain, channel region and source in P2, N1 and P1, respectively.

According to a preferred aspect of the present invention, the doping concentration of P3 is relatively low compared to prior art IGBTs. This reduces the hole injection efficiency at the P3-N2 junction and allows the first quadrant current (I) from T2 to T1 to be saturated to high voltages. This results in a significant improvement in safe-operating-area (SOA) at the cost of a relatively small increase in forward voltage drop as compared to prior art IGBTs which have relatively highly doped P3 regions. As will be understood by those skilled in the art, the N2, P2, N1 regions also form an N-P-N transistor (Q5) which is coupled with Q4. Q4 and Q5 also form an additional thyristor between T2 and T1, as illustrated by FIG. 7b. However, the emitter-base junction of Q5 is shunted by M2 which acts to suppress latch-up of this additional thyristor during the first quadrant mode of operation. Accordingly, M2 may be designed so that the series voltage from P2 (drain) to P1 (source) does not exceed the built-in potential of the emitter-base P2-N1 junction of Q5 when operating at rated currents. With respect to certain applications, however, it may become desirable to operate the switching device as an IGBT and a thyristor during the first quadrant mode of operation. This can be done by properly biasing the gate electrodes so that latch-up of the additional thyristor is achieved. This aspect of the present invention is more fully described in copending, commonly assigned U.S. application Ser. No. 08/194,259, entitled "*Multifunctional Semiconductor Switching Device Have Gate-Controlled Regenerative and Non-Regenerative Conduction Modes and Method of Operating Same*", the disclosure of which is hereby incorporated herein by reference.

Figure 7D:
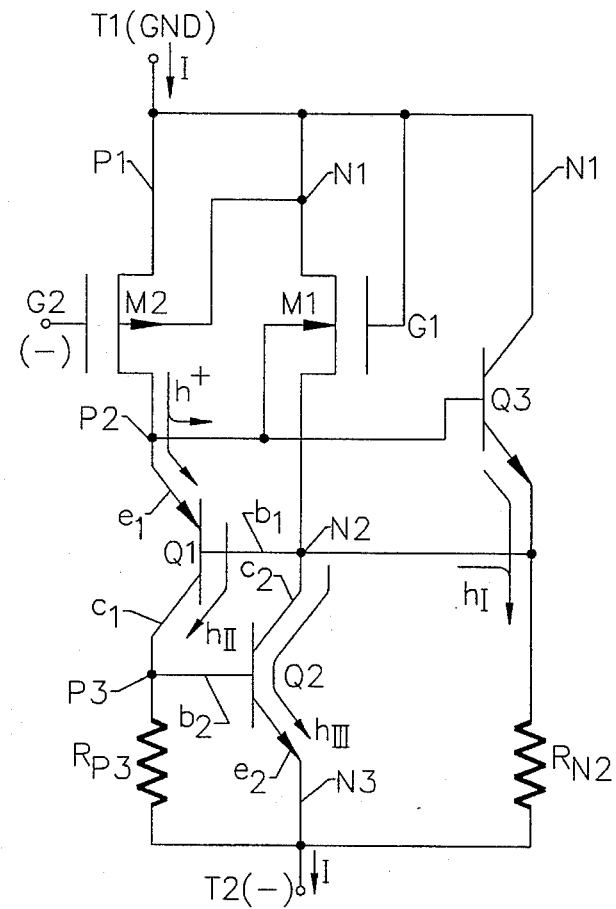
FIG. 7d is an electrical schematic representation of the switching cell of FIG. 7c.
Figure 7C:
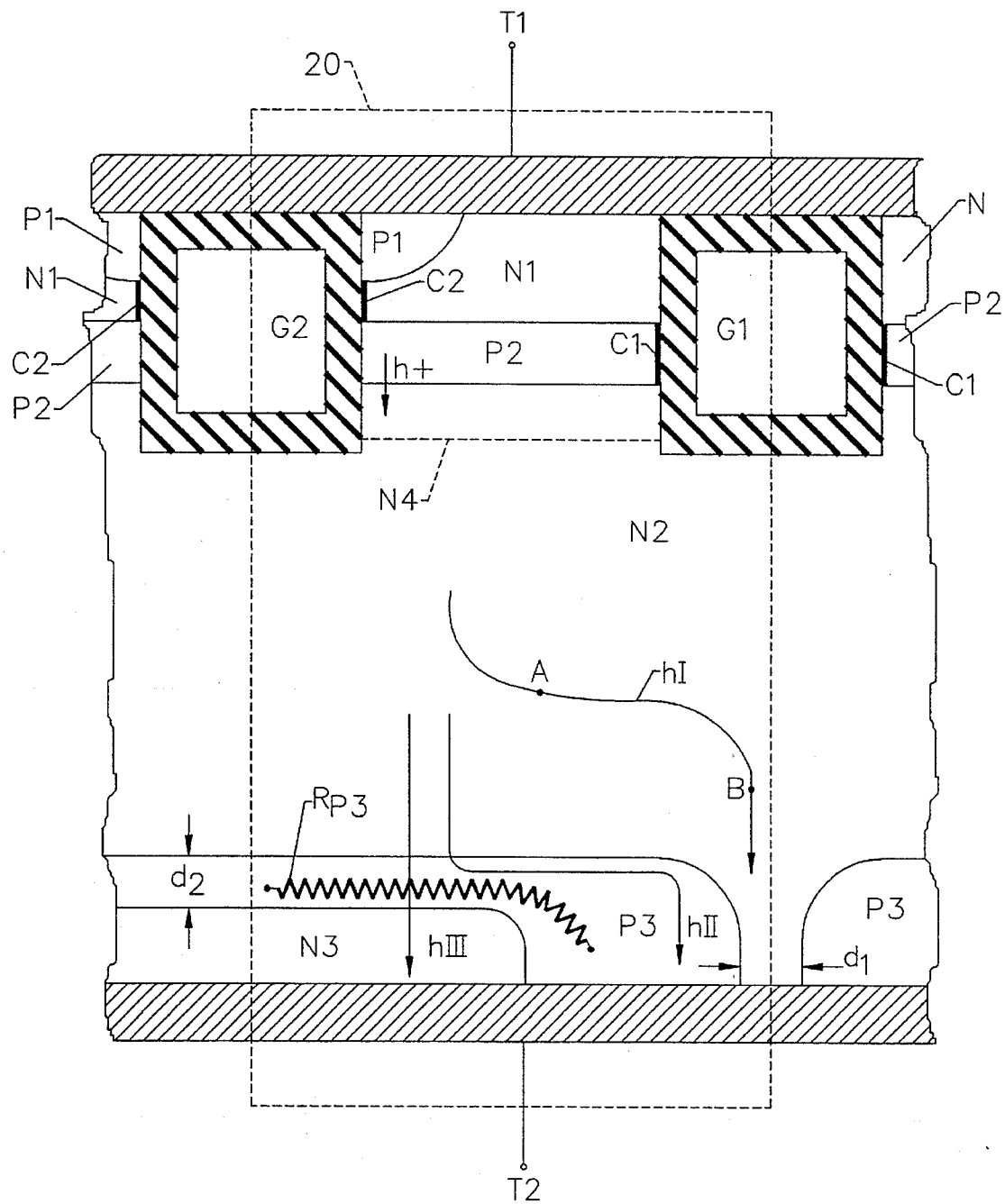
FIG. 7c is a cross-sectional illustration of the switching cell of FIG. 6, in a third quadrant mode of operation.

Referring now to FIGS. 7c–d, the third quadrant mode of operation will be explained. The third quadrant mode of operation can be initiated by maintaining G1 and T1 at ground potential and biasing G2 and T2 negative relative to T1. This biasing scheme turns on M2 and electrically connects P1 to P2 by the series channel C2. As will be understood by those skilled in the art, the relatively positive bias on T1 causes holes ($h^+$) to flow from T1 to P2. These holes are then injected into the drift region N2 because of the forward bias across the P-N junction formed between P2 and N2. As illustrated by FIG. 7c, these holes then initially flow downward across the drift region N2 and to the second device terminal T2 along a first path (shown as $h_I$). Because the adjacent third device regions P3 are relatively closely spaced (shown as "$d_1$"), the resistance $R_{N2}$ along the first path $h_I$ (from points A to B) is relatively high. The size of $R_{N2}$ causes the voltage in the drift region N2 just above P3 no rise sufficiently and to reverse bias the P-N junction formed by regions N2 and P3. This causes the third device region P3 to act as a collector of holes as shown by the second path $h_{II}$. At sufficiently high current densities, a majority of the hole current will flow through P3 and encounter the resistance $R_{P3}$ which is determined by the distance "$d_2$" between the bottoms of N3 and P3. If $R_{P3}$ is sufficiently large, the voltage drop in P3 will exceed the built-in potential of the lowermost P-N junction between the third and fourth device regions P3 and N3. This will cause the forward biasing of the lowermost P-N junction and latch the P-N-P-N thyristor formed by the coupled bipolar junction transistors: P2-N2-P3 (Q1) and N2-P3-N3 (Q2), where P2, N3, P3 and N2 are the first and second emitters ($e_1$, $e_2$) and first and second collectors ($c_1$, $c_2$) of the thyristor, respectively. This P-N-P-N thyristor is electrically connected in antiparallel with Q4 of FIG. 7b.

The current will then traverse the drift region N2 as illustrated by the third path $h_{III}$. The latching of the thyristor will also cause the voltage potential of P2 to "track" the potential of T2 and this change in voltage of P2 will appear across the reversed biased P2-N1 junction. This may then cause the potential difference between G1 and P2 to be greater than the threshold voltage of M1 and cause the formation of a series inversion layer channel C1, between N1 and N2, as illustrated. This inversion layer channel shunts the uppermost P2-N2 junction of the thyristor (i.e., emitter-base junction of Q1). Once the channel C1 is formed, T2 will begin to rise more rapidly and further changes in the voltage potential of P2 will be limited. The rate of change in voltage across the reversed biased P2-N1 junction is a function of: (i) the potential of G2; (ii) the injection efficiency of the bottom N3-P3-N2 (Q2) transistor; and (iii) the recombination rate in the drift region N2.

Preferably, the injection efficiency of the Q2 is kept low so as to keep the voltage drop across the P2-N1 junction almost constant during latch-up. This can be achieved by reducing the peak doping concentration of the N3 region in order to limit the injection of electrons across the forward biased N3-P3 junction. Because the hole current for the P2-N2-P3 transistor Q1 is provided by M2 and because N3-P3-N2 transistor Q2 current is shunted through M1, the thyristor current is gate-controlled by G2. Moreover, because the M1 shunt reduces the emitter efficiency of Q1 and because N3 is a relatively poor emitter, the hole and electron densities in the drift region N2 are limited. This results in relatively low space charge and hence more uniform field distribution in the drift region, resulting in a relatively high safe-operating-area (SOA).

According to another aspect of the present invention, the drift region N2 may also include a more highly doped region of first conductivity type between the trenches, as illustrated. This region, shown as N4, will reduce the amount of current flow through the Q3 transistor by reducing the voltage drop due to lateral current flow under the P2 region at the P2-N2 junction. The absence of this region will typically result in a relatively large amount of electron current flow through the Q3 transistor. This current flow can cause an increase in the voltage drop across the P2-N1 junction and lead to poor current saturation characteristics. The P2-N1 junction is also susceptible to breakdown under these conditions.

Figure 8:
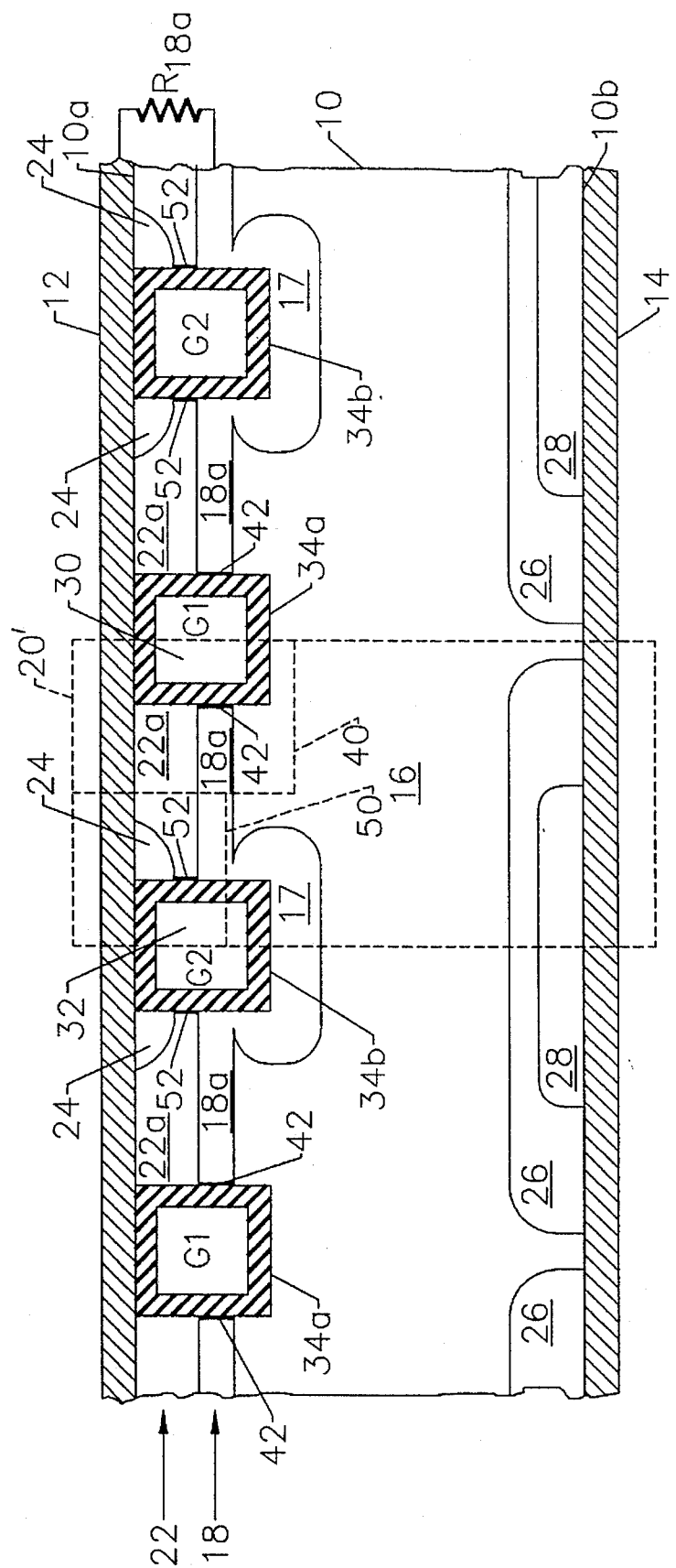
FIG. 8 is a cross-sectional illustration of a bidirectional semiconductor switching device including a plurality of switching cells, according to a second embodiment of the present invention.

Referring now to FIG. 8, a bidirectional semiconductor switching device according to a second embodiment of the present invention is illustrated. The switching device includes a plurality of parallel-connected unit switching cells 20'. The unit cell 20' is similar to the unit cell 20 of FIG. 6, however, a second conductivity type "halo" 17 is included at the bottom of the second trench 34b, as illustrated. The halo 17 is preferably formed using a relatively low-dose second conductivity type implant into the bottom of the second trench 34b followed by diffusion. As will be understood by those skilled in the art, the inclusion of the halo 17 improves the SOA during the first quadrant mode of operation by increasing the current flow through the second first insulated-gate field effect transistor 50 and by increasing the hole collection efficiency at the bottom of the second trench 34b which reduces the lateral hole current in P2. In the third quadrant mode of operation, the halo 17 increases hole injection across the P-N junction between regions 18a and 22a and this reduces the forward voltage drop from T1 to T2.

Figure 9:
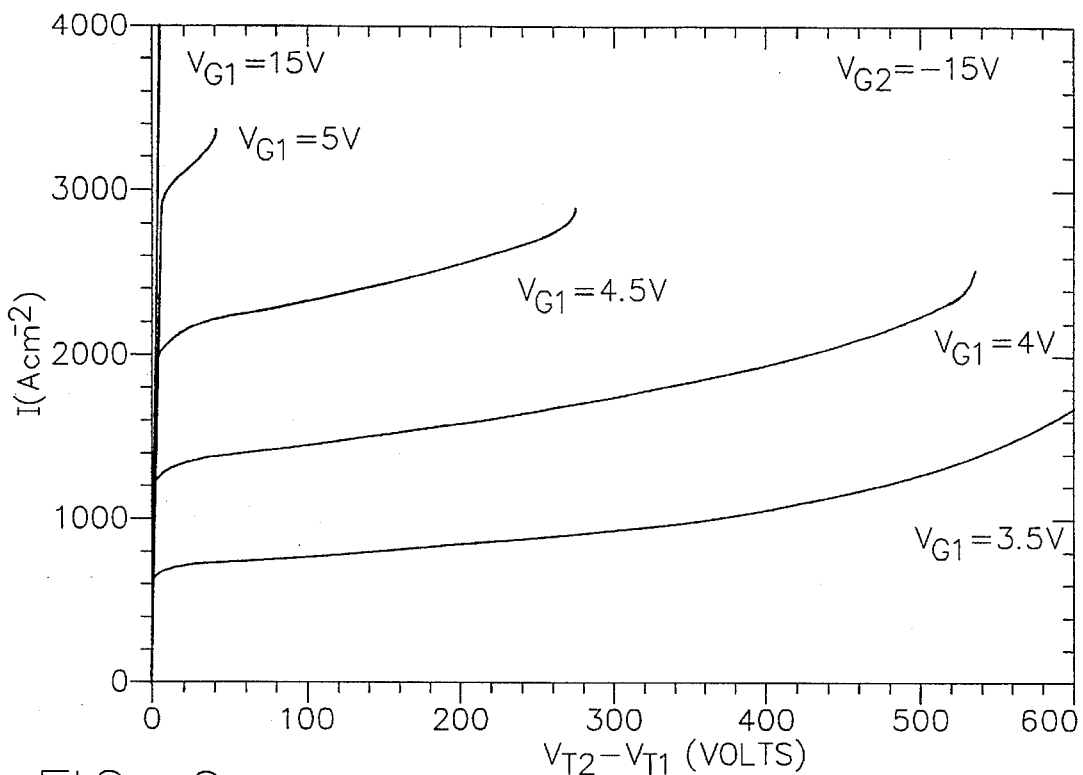
FIG. 9 is a graph containing I-V curves illustrating first quadrant current density versus terminal voltage at four different gate biases, for the switching device of FIG. 6.

Referring now to FIG. 9, I-V curves illustrating simulated first quadrant current density versus terminal voltage for the bidirectional switching device of FIG. 6 are provided at four different gate biases (G1): 3.5, 4, 4.5 and 5 Volts. The on-state voltage drop is 1.3 Volts for a G1 bias of 15 Volts and a G2 bias of −15 Volts. The I-V curves have excellent FBSOA characteristics. For instance, current densities of 1000 A $cm^{-2}$ can be saturated up to 600 Volts. The simulated device has the parameters as set forth below in Table 1.

TABLE 1

| Region | Composition | $N_D/N_A$ | Thickness/ Depth | Width (unit cell) |
|---|---|---|---|---|
| 12 | metal | — | — | — |
| 14 | metal | — | — | — |
| 16 | Si | $1 \times 10^{14}$ | 100 μm | 4 μm |
| 18a | Si | $2 \times 10^{17}$ | 3.5 μm | 2 μm |
| 20 | — | — | — | 4 μm |
| 22a | Si | $5 \times 10^{17}$ | 1.5 μm | 2 μm |
| 24 | Si | $5 \times 10^{19}$ | 0.5 μm | 0.5 μm |
| 26 | Si | $5 \times 10^{17}$ | 6 μm | — |
| 28 | Si | $1 \times 10^{19}$ | 4 μm | — |
| 30 | poly-Si | $>1 \times 10^{20}$ | — | — |
| 32 | poly-Si | $>1 \times 10^{20}$ | — | — |
| 34a | — | — | — | 1 μm |
| 34b | — | — | — | 1 μm |

Figure 10:
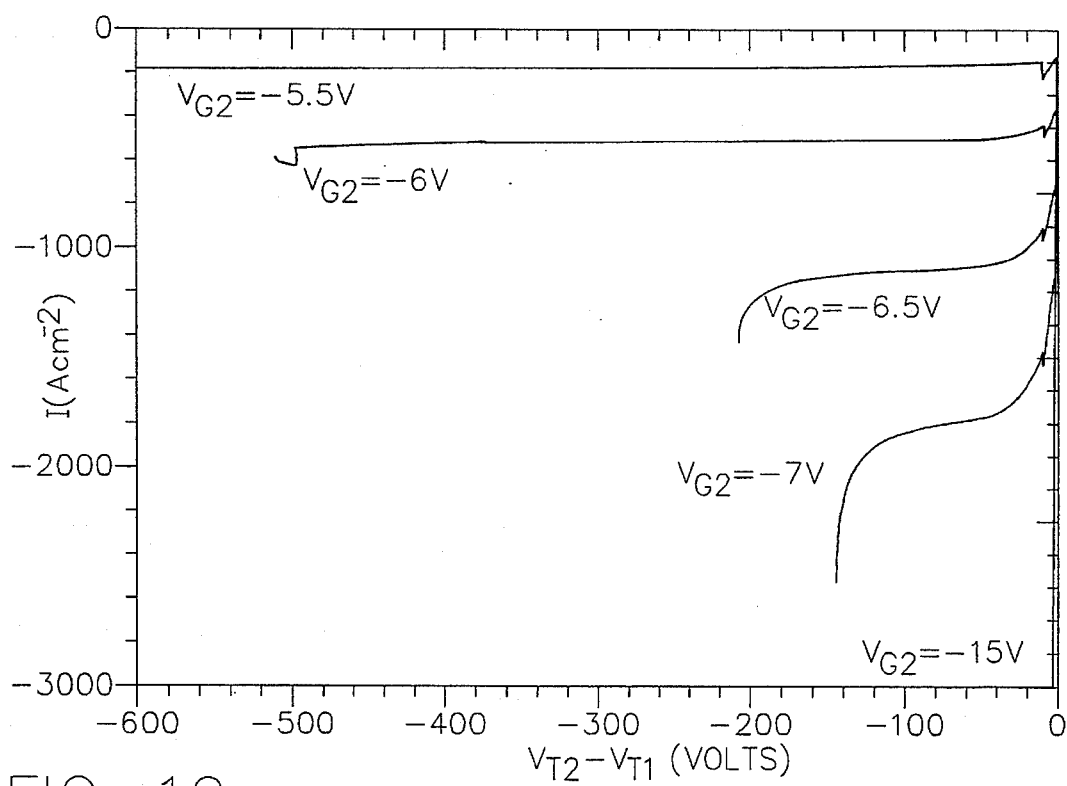
FIG. 10 is a graph containing I-V curves illustrating third quadrant current density versus terminal voltage at four different gate biases, for the switching device of FIG. 6.

Referring now to FIG. 10, I-V curves illustrating simulated third quadrant current density versus terminal voltage for the bidirectional switching device of FIGS. 6 and 9 are provided at four different gate biases (G2): −5.5, −6, −6.5, −7 Volts. The I-V curves have excellent FBSOA characteristics. For instance, a thyristor current of 500 A cm$^{-2}$ can be saturated up to 500 Volts.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A bidirectional semiconductor switching device, comprising:

a semiconductor substrate having first and second opposing faces;

a first device terminal on the first face;

a second device terminal on the second face;

first and second adjacent trenches in said substrate, at the first face;

a first semiconducting device region of first conductivity type in said substrate;

a second semiconducting device region of second conductivity type in said substrate, between said first device region and said first device terminal and between said first and second trenches;

an insulated-gate bipolar transistor in said substrate for providing conduction from said second device terminal to said first device terminal, said insulated-gate bipolar transistor comprising a base in said first device region and a collector in said second device region; and a thyristor in said substrate, electrically connected in antiparallel with said insulated-gate bipolar junction transistor so as to provide conduction from said first device terminal to said second device terminal, said thyristor comprising a first emitter in said second device region.

2. The switching device of claim 1, wherein said second device region is a semiconducting layer of second conductivity type and wherein said first and second trenches extend through said semiconducting layer of second conductivity type and into said first device region.

3. The switching device of claim 1, further comprising a first source region of first conductivity type between said second device region and said first device terminal.

4. The switching device of claim 3, wherein said insulated-gate bipolar transistor comprises a first insulated-gate field effect transistor and wherein said first device region, said second device region and said first source region comprise the drain, channel region and source of the first insulated-gate field effect transistor.

5. The switching device of claim 4, further comprising a second source region of second conductivity type adjacent said first source region and forming a P-N junction therewith.

6. The switching device of claim 5, wherein said first and second source regions ohmically contact said first device terminal at the first face.

7. The switching device of claim 6, wherein said second source region comprises a diffused second conductivity type well in said first source region which extends adjacent a sidewall of said second trench.

8. The switching device of claim 5, further comprising a second insulated-gate field effect transistor in said substrate and wherein said second device region, said first source region and said second source region comprise the drain, channel region and source of said second insulated-gate field effect transistor.

9. The switching device of claim 8, wherein said thyristor and said second insulated-gate field effect transistor are electrically connected in series, between said first device terminal and said second device terminal.

10. The switching device of claim 8, wherein said insulated-gate bipolar transistor and said second insulated-gate field effect transistor are electrically connected in series, between the first device terminal and the second device terminal.

11. The switching device of claim 10, wherein said thyristor and said second insulated-gate field effect transistor are electrically connected in series, between said first device terminal and said second device terminal.

12. The switching device of claim 11, wherein said first and second insulated-gate field effect transistors comprise vertical MOSFETs in said first and second trenches, respectively.

13. The switching device of claim 1, further comprising:

a third semiconducting device region of second conductivity type in said substrate, ohmically contacting said second device terminal and forming a P-N junction with said first device region; and a fourth semiconducting device region of first conductivity type in said substrate, ohmically contacting said second device terminal and forming a P-N junction with said third device region.

14. The switching device of claim 13, wherein said insulated-gate bipolar transistor further comprises an emitter in said third device region; and wherein said thyristor further comprises a second emitter in said fourth device region.

15. The switching device of claim 13, wherein said first device region ohmically contacts said second device terminal.

16. The switching device of claim 15, wherein said fourth device region is in said third device region and extends adjacent the second face.

17. The switching device of claim 16, wherein said third device region comprises a diffused second conductivity type well at the second face; and wherein said fourth device region comprises a diffused first conductivity type well in said third device region.

18. The switching device of claim 17, wherein said insulated-gate bipolar transistor further comprises an emitter in said third device region; and wherein said thyristor comprises a first base and a first collector in said first and third device regions, respectively, and a second base and second collector in said third and first device regions, respectively.

19. The switching device of claim 11, wherein said second device region further comprises a diffused halo of second conductivity type adjacent a bottom of said second trench.

20. A bidirectional semiconductor switching device, comprising:

a semiconductor substrate;

a first device terminal and a second device terminal on said substrate;

a first semiconducting device region of first conductivity type in said substrate;

a second semiconducting device region of second conductivity type in said substrate, said second device region forming a P-N junction with said first device region;

a bipolar junction transistor in said substrate for providing non-regenerative conduction in a forward direction from said second device terminal to said first device terminal, said bipolar junction transistor having a base in said first device region and a collector in said second device region;

a first field effect transistor in said substrate, electrically connected in series between said first device region and said first device terminal;

a thyristor in said substrate for providing regenerative conduction in a forward direction from said first device terminal to said second device terminal, said thyristor having a first emitter in said second device region; and a second field effect transistor in said substrate, electrically connected in series between said second device region and said first device terminal.

21. The switching device of claim 20, further comprising:

a first source region of first conductivity type in said substrate, ohmically contacting said first device terminal; and a second source region of second conductivity type in said substrate, ohmically contacting said first device terminal and forming a P-N junction with said first source region; and wherein the application of a first gate bias signal to said first field transistor causes the formation of an inversion layer channel in said second device region which electrically connects said first device region to said first source region.

22. The switching device of claim 21, wherein the application of a second gate bias signal to said second field effect transistor causes the formation of an inversion layer channel in said first source region which electrically connects said second device region to said second source region.

23. The switching device of claim 22 further comprising:

first and second adjacent trenches in said substrate at a face thereof;

an insulated gate electrode of said first field effect transistor in said first trench; and an insulated gate electrode of said second field effect transistor in said second trench.

24. The switching device of claim 23, wherein said first field effect transistor is also electrically connected in series between a second collector of said thyristor and said first device terminal.

25. The switching device of claim 23, wherein said second device region and said first and second source regions extend between said first and second trenches.

26. The switching device of claim 25, wherein said first and second trenches have sidewalls which extend between said first device region and the face of said substrate.

27. The switching device of claim 23, further comprising:

a third semiconducting device region of second conductivity type in said substrate, ohmically contacting said second device terminal and forming a P-N junction with said first device region; and a fourth semiconducting device region of first conductivity type in said substrate, ohmically contacting said second device terminal and forming a P-N junction with said third device region.

28. The switching device of claim 27, wherein said third device region comprises an emitter of said bipolar transistor; and wherein said fourth device region comprises a second emitter of said thyristor.

29. The switching device of claim 24, wherein said first and second field effect transistors comprise vertical MOSFETs.

30. The switching device of claim 27, further comprising:

a plurality of said third device regions in said substrate which ohmically contact said second device terminal; and wherein said first device region ohmically contacts said second device terminal between adjacent ones of said plurality of said third device regions.

31. A semiconductor switching device, comprising:

a semiconductor substrate having first and second opposing faces and a drift region of first conductivity type therein;

a first semiconducting layer of second conductivity type on said drift region;

a second semiconducting layer of first conductivity type on said first semiconducting layer, opposite said drift region;

a first device terminal on the first face and electrically contacting said second semiconducting layer;

first and second trenches in said substrate, at the first face, said first and second trenches extending through said first and second semiconducting layers;

a first semiconducting well of second conductivity type in said drift region, at the second face;

a second semiconducting well of first conductivity type in said first semiconducting well and forming a P-N junction therewith;

a second device terminal on the second face and electrically contacting said first and second semiconducting wells.

32. The switching device of claim 31, further comprising a source region of second conductivity type in said second semiconducting layer and forming a P-N junction therewith.

33. The switching device of claim 32, wherein said first device terminal ohmically contacts said second semiconducting layer and said source region; and wherein said second device terminal ohmically contacts said first and second semiconducting wells and said drift region.

34. The switching device of claim 33, wherein at least one of said first and second trenches extends through said first semiconducting layer and into said drift region.

35. The switching device of claim 34, further comprising a diffused halo of second conductivity type which extends adjacent a bottom of at least one of said first and second trenches and forms a P-N junction with said drift region.

36. A semiconductor switching device, comprising:

a semiconductor substrate having first and second opposing faces;

a first device terminal on the first face;

a second device terminal on the second face;

a first semiconducting device region of first conductivity type in said substrate;

a second semiconducting device region of second conductivity type adjacent said first device region and forming a P-N junction therewith in said substrate;

a third semiconducting device region of second conductivity type adjacent said first device region and forming a P-N junction therewith in said substrate, and wherein said first device region extends between said second and third device regions and wherein said third device region ohmically contacts said second device terminal at the second face;

a fourth semiconducting device region of first conductivity type adjacent said third device region and forming a P-N junction therewith in said substrate, said fourth device region ohmically contacting said second device terminal at the second face;

a first insulated-gate field effect transistor in said substrate, said first insulated-gate field effect transistor having a drain in said first device region and a source electrically contacting said first device terminal; and a second insulated-gate field effect transistor in said substrate, said second insulated-gate field effect transistor having a drain in said second device region and a source electrically contacting said first device terminal;

wherein said first, second, third and fourth semiconducting device regions comprise a thyristor having a first emitter in said second semiconducting device region and a second emitter in said fourth semiconducting device region; and wherein said first, second and third semiconducting device regions comprise a bipolar junction transistor having an emitter in said third semiconducting device region and a collector in said second semiconducting device region.

37. A switching device, comprising:

a semiconducting substrate;

a first device terminal on said semiconducting substrate;

a second device terminal on said semiconducting substrate;

a thyristor in said semiconducting substrate, said thyristor comprising a pair of regeneratively coupled P-N-P and N-P-N bipolar junction transistors;

a first field effect transistor in said substrate, electrically connected in series between a base of one of said pair of bipolar junction transistors and said first device terminal; and a second field effect transistor in said substrate, electrically connected in series between an emitter of said one of said pair of bipolar junction transistors and said first device terminal.

* * * * *